United States Patent
Jain

(10) Patent No.: US 7,247,535 B2
(45) Date of Patent: Jul. 24, 2007

(54) SOURCE/DRAIN EXTENSIONS HAVING HIGHLY ACTIVATED AND EXTREMELY ABRUPT JUNCTIONS

(75) Inventor: Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 124 days.

(21) Appl. No.: 10/955,270

(22) Filed: Sep. 30, 2004

(65) Prior Publication Data

US 2006/0073665 A1   Apr. 6, 2006

(51) Int. Cl.
*H01L 21/8238* (2006.01)

(52) U.S. Cl. ............. 438/233; 438/299; 438/483; 438/488; 438/492; 438/586; 257/E21.634

(58) Field of Classification Search ........... 438/233, 438/300, 694, 301, 299, 483, 488, 492, 586; 257/E21.634
See application file for complete search history.

(56) References Cited

U.S. PATENT DOCUMENTS

| | | | | |
|---|---|---|---|---|
| 6,060,392 A | * | 5/2000 | Essaian et al. ............. | 438/682 |
| 6,063,677 A | * | 5/2000 | Rodder et al. ............. | 438/300 |
| 6,156,654 A | * | 12/2000 | Ho et al. .................. | 438/683 |
| 6,509,241 B2 | * | 1/2003 | Park et al. ................ | 438/303 |
| 6,624,477 B1 | * | 9/2003 | Takemura et al. ......... | 257/351 |
| 6,673,665 B2 | * | 1/2004 | Wieczorek et al. ........ | 438/233 |
| 6,812,106 B1 | * | 11/2004 | Xiang et al. .............. | 438/301 |
| 6,872,626 B1 | * | 3/2005 | Cheng ....................... | 438/299 |
| 2003/0211684 A1 | * | 11/2003 | Guo .......................... | 438/230 |

* cited by examiner

*Primary Examiner*—George R. Fourson
*Assistant Examiner*—Julio J. Maldonado
(74) *Attorney, Agent, or Firm*—Rose Alyssa Keagy; W. James Brady; Frederick J. Telecky, Jr.

(57) ABSTRACT

A method for making a transistor within a semiconductor wafer. The method may include etching a recess at source/drain extension locations 90 and depositing SiGe within the recess to form SiGe source/drain extensions 90. Dopants are implanted into the SiGe source/drain extensions 90 and the semiconductor wafer 10 is annealed. Also, a transistor source/drain region 80, 90 having a SiGe source/drain extension 90 that contains evenly distributed dopants, is highly doped, and has highly abrupt edges.

21 Claims, 18 Drawing Sheets

SOURCE/DRAIN EXTENSIONS HAVING HIGHLY ACTIVATED AND EXTREMELY ABRUPT JUNCTIONS

BACKGROUND OF THE INVENTION

This invention relates to transistor source/drain extensions in semiconductor wafers.

DETAILED DESCRIPTION OF THE INVENTION

Figure 1:
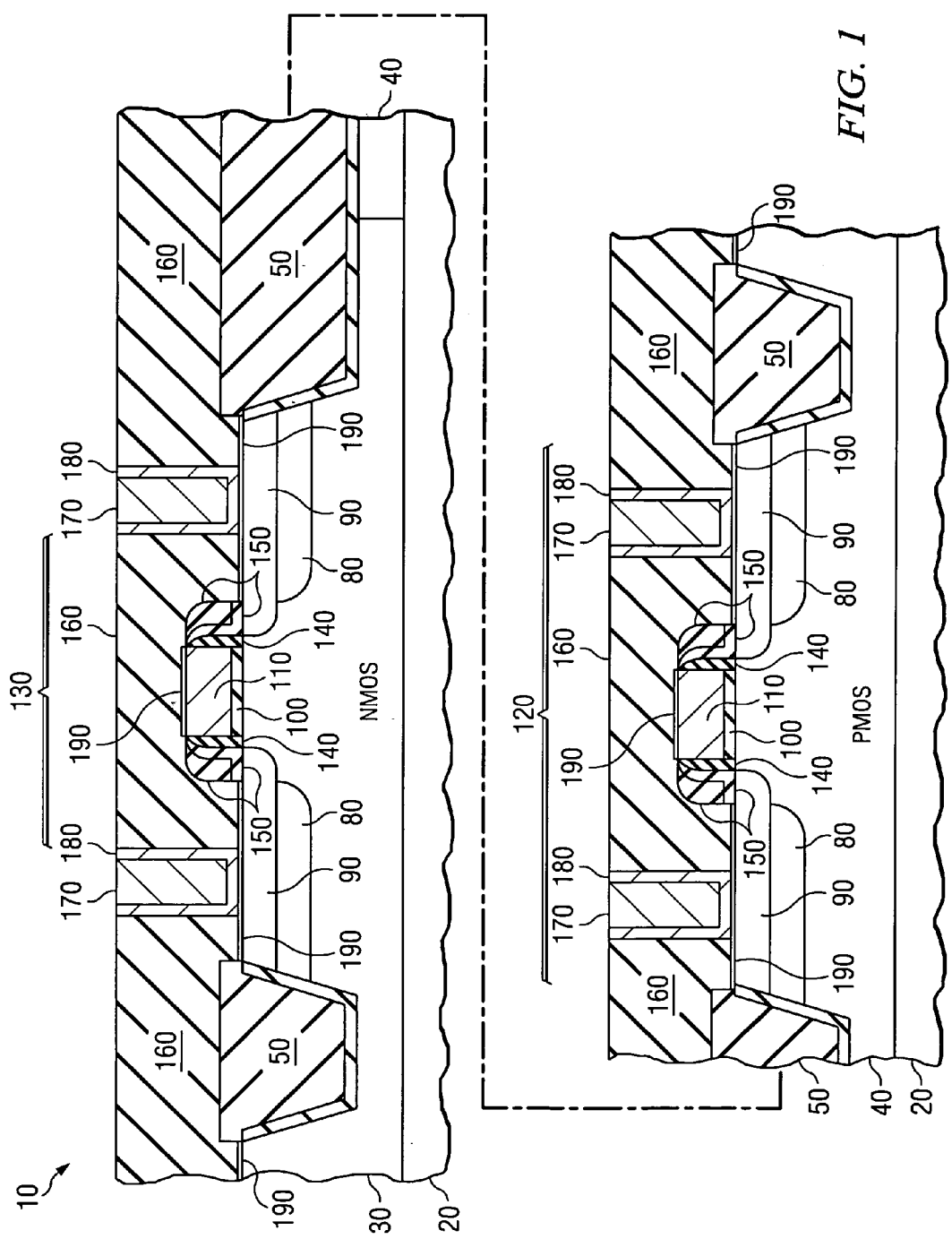
FIG. 1 is a cross-sectional view of a partially fabricated semiconductor wafer in accordance with the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of a partially fabricated semiconductor wafer 10 in accordance with the present invention. In the example application, CMOS transistors 120, 130 are formed within a semiconductor substrate 20 having an NMOS region 30 and a PMOS region 40. However, it is within the scope of the invention to use a semiconductor wafer 10 that contains any one of a variety of semiconductor devices, such as bipolar junction transistors, capacitors, or diodes.

The example CMOS transistors 120, 130 are electrically insulated from other active devices (not shown) by shallow trench isolation structures 50 formed within the NMOS and PMOS regions 30, 40; however, any conventional isolation structure may be used such as field oxide regions (also known as "LOCOS" regions) or implanted isolation regions. The semiconductor wafer 10 is a single-crystalline substrate that is doped to be n-type and p-type; however, it may be formed by fabricating an epitaxial silicon layer on a single-crystal substrate.

In general, transistors are comprised of a gate, source, and drain. More specifically, as shown in FIG. 1, the active portion of the transistors 120, 130 contain source/drain regions 80, 90 comprised of deep sources/drains 80 and source/drain extensions 90. In addition, the active portion of the transistors 120, 130 contains a gate that is comprised of a gate oxide 100 and a gate polysilicon electrode 110.

The example PMOS transistor 120 is a p-channel MOS transistor. Therefore it is formed within a n-well region 40 of the semiconductor wafer 10. In addition, the deep sources and drains 80 and the source and drain extensions 90 have p-type dopants. The source and drain extensions 90 may be lightly doped ("LDD"), medium doped ("MDD"), or highly doped ("HDD"). The PMOS transistor gate is created from p-type doped polysilicon 110 and a gate oxide dielectric 100.

Similarly, the example NMOS transistor 130 is an n-channel MOS transistor. Therefore it is formed within a p-well region 30 of the semiconductor wafer 10. In addition, the deep sources and drains 80 and the source and drain extensions 90 have n-type dopants. Similar to PMOS transistor 120, the source and drain extensions 90 of NMOS transistor 130 may be lightly doped ("LDD"), medium doped ("MDD"), or highly doped ("HDD"). The NMOS transistor gate is created from n-type doped polysilicon 110 and a gate oxide dielectric 100.

A sidewall spacer structure comprising offset layers 140, 150 are used during fabrication to enable the proper placement of the source/drain extensions 90 and the silicide 190 (described more fully below). The source/drain extension regions 90 are formed using the gate stack 100, 110 and the extension sidewall spacers 140 as a mask. The silicides 190 are formed using the gate stack 100, 110 and the contact sidewall spacers 150 as a mask. It is to be noted that the deep sources/drains 80 are formed using disposable deep source/drain sidewall spacers 142, 144 (FIGS. 2C-2E), as described more fully below.

Immediately above and surrounding the transistors is a layer of dielectric insulation 160. The composition of dielectric insulation 160 may be any suitable material such as $SiO_2$ or organosilicate glass ("OSG"). The dielectric material 160 electrically insulates the metal contacts 170 that electrically connect the CMOS transistors 120, 130 shown in FIG. 1 to other active or passive devices (not shown) located throughout the semiconductor wafer 10. An optional dielectric liner (not shown) may be formed before the placement of the dielectric insulation layer 160. If used, the dielectric liner may be any suitable material such as silicon nitride.

In the example application, the contacts 170 are comprised of W; however, any suitable material (such as Cu, Ti, or Al) may be used. In addition, an optional liner material 180 such as Ti, TiN, or Ta (or any combination or layer stack thereof) may be used to reduce the contact resistance at the interface between the liner 180 and the silicided regions 190 of the gate polysilicon layer 110 and the source/drain extensions 90.

Subsequent fabrication will create the "back-end" portion (not shown) of the semiconductor wafer 10. The back-end generally contains one or more interconnect layers (and possibly via layers) that properly route electrical signals and power though out the completed integrated circuits.

The source/drain extensions 90 are preferably made of SiGe. In addition, the source/drain extensions 90 contain a high level of dopants that are evenly distributed. More specifically, PMOS transistors 120 have highly activated SiGe source/drain extensions 90 that are evenly doped with B at a concentration above $2 \times 10^{20}$ atoms/cc. However, it is within the scope of the invention to use any suitable dopant or dopant mixture, such as $BF_2$ at a concentration above $2 \times 10^{20}$ atoms/cc. Similarly, NMOS transistors 130 have highly activated SiGe source/drain extensions 90 that are evenly doped with P at a concentration above $4 \times 10^{20}$ atoms/cc or As at a concentration above $4 \times 10^{20}$ atoms/cc. However, it is within the scope of the invention to use any suitable dopant or dopant mixture, such as As plus P at a concentration above $8\times10^{20}$ atoms/cc.

In addition, the SiGe source/drain extensions 90 have highly abrupt edges. More specifically, the SiGe source/drain extensions 90 have abrupt junctions where dopants have negligible diffusion across the boundary with the silicon substrate 30, 40.

These heavily doped (i.e. highly activated) SiGe source/drain extensions 90 having evenly distributed dopants and highly abrupt edges have a lowered sheet resistance and thereby improved scalability. The improved scalability comes from a reduction in junction depth and an increase in the gradient of the dopant profile at the junction.

Figure 2A:
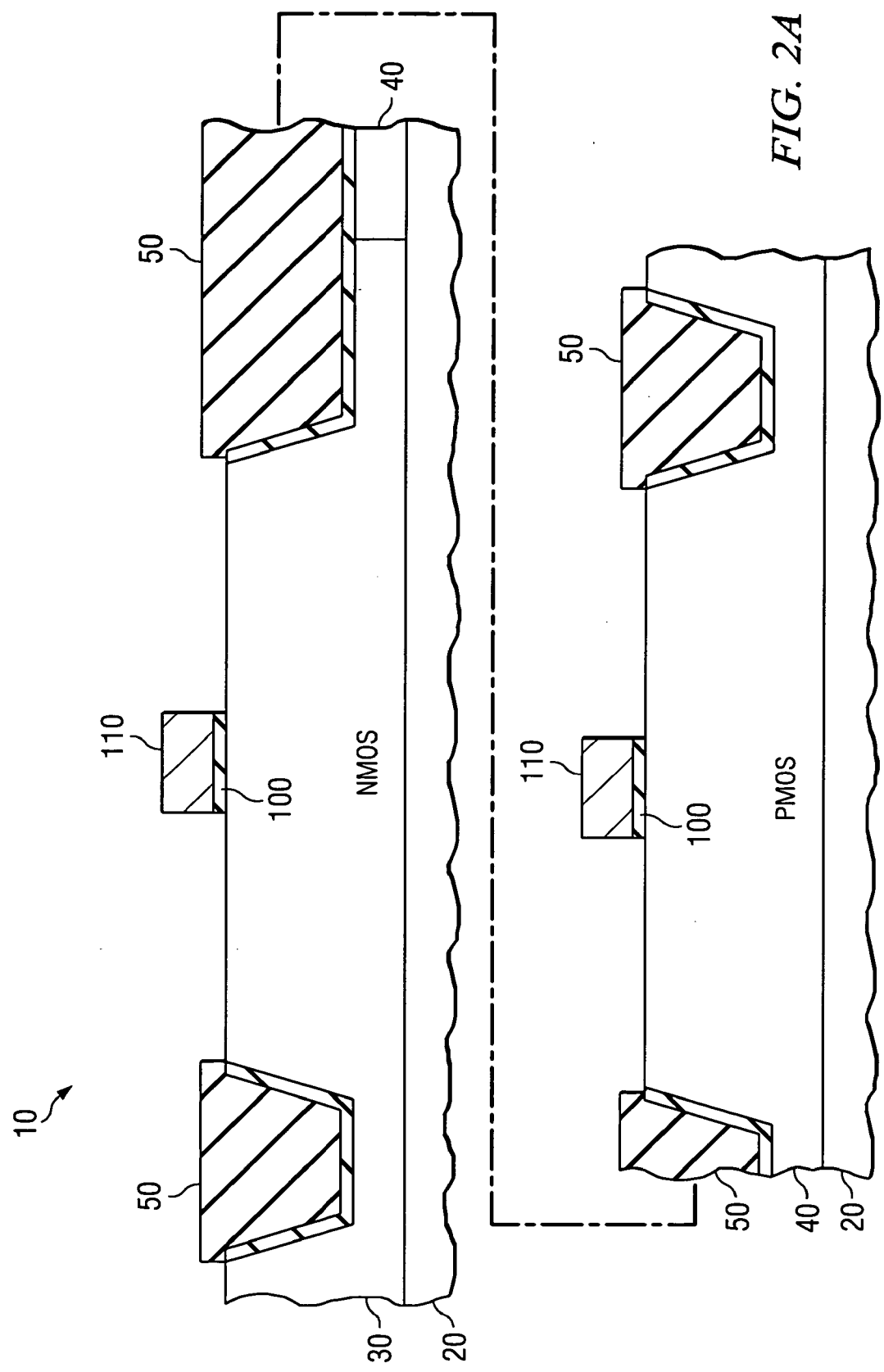
FIGS. 2A-2Q are cross-sectional diagrams of a process for forming transistors in accordance with the present invention.
Figure 2B:
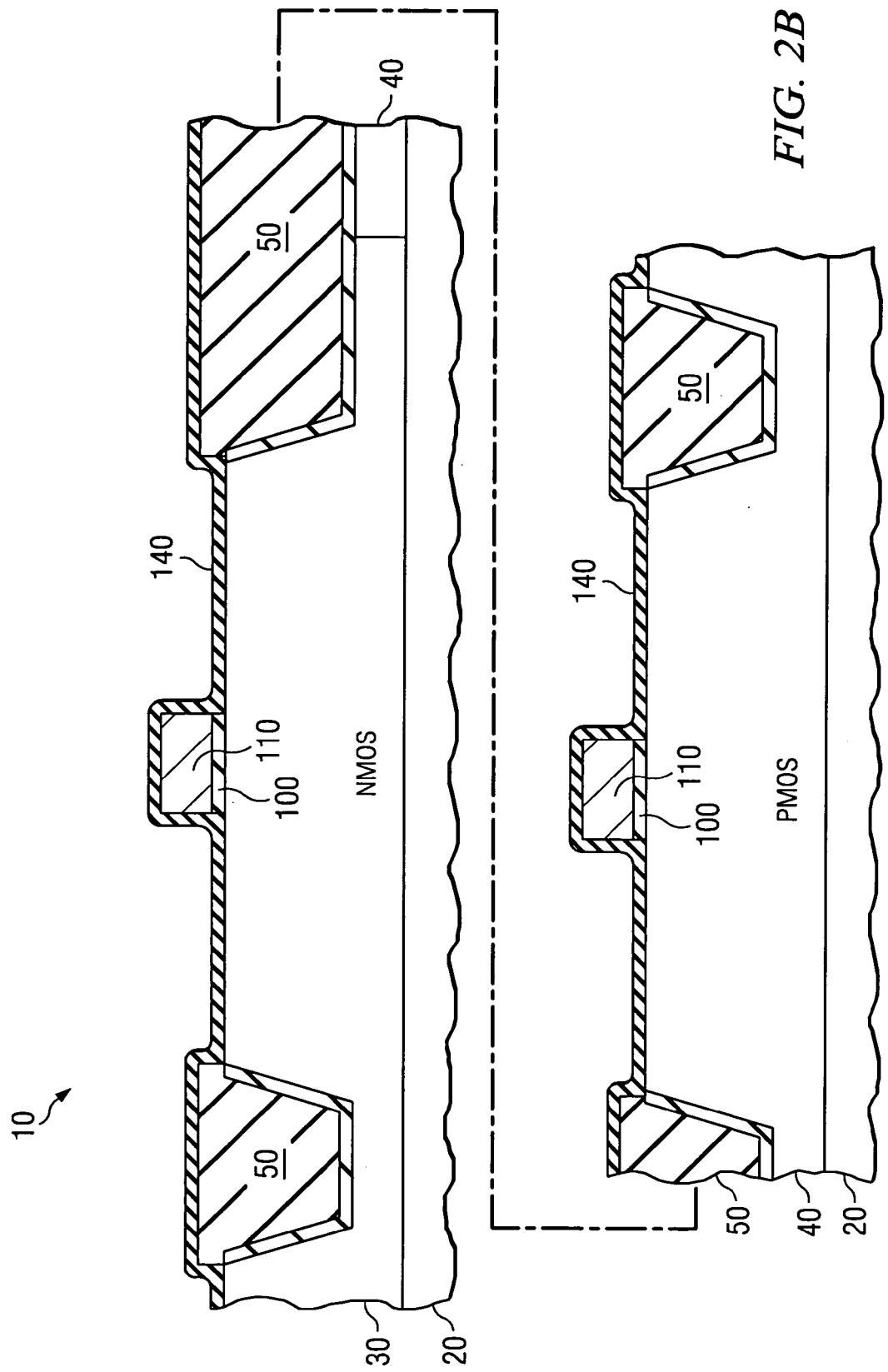
Figure 2C:
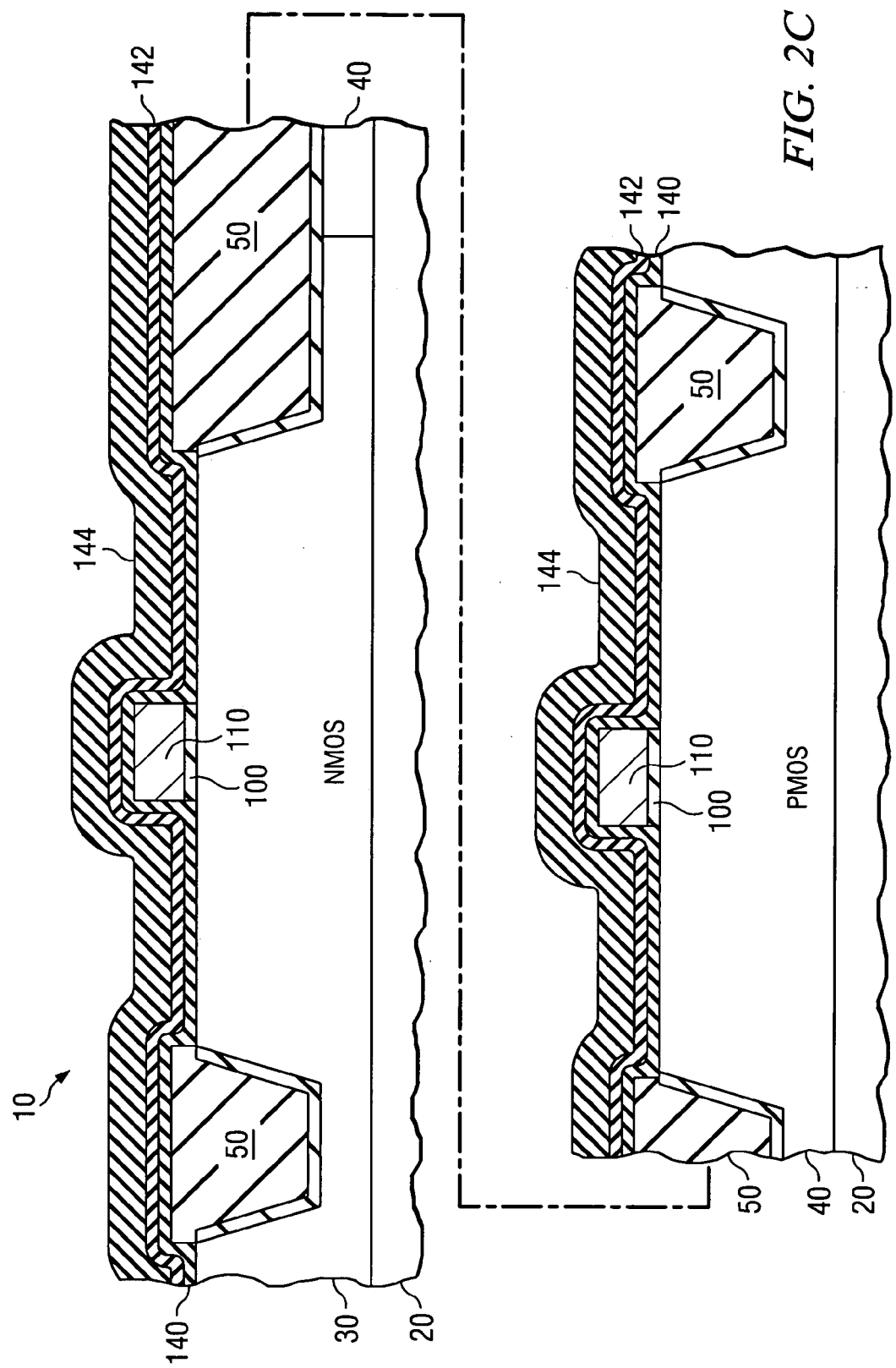
Figure 2D:
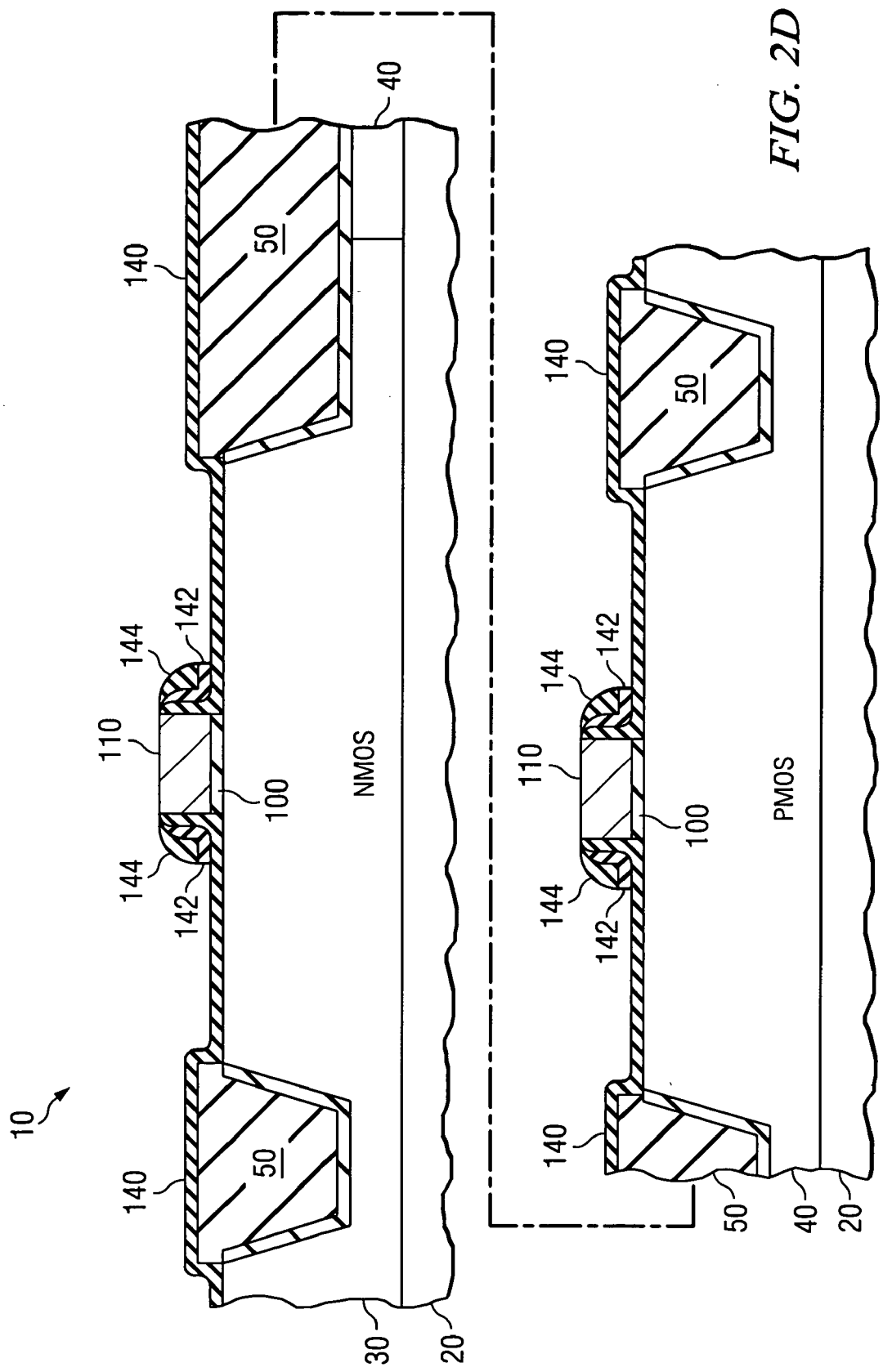
Figure 2E:
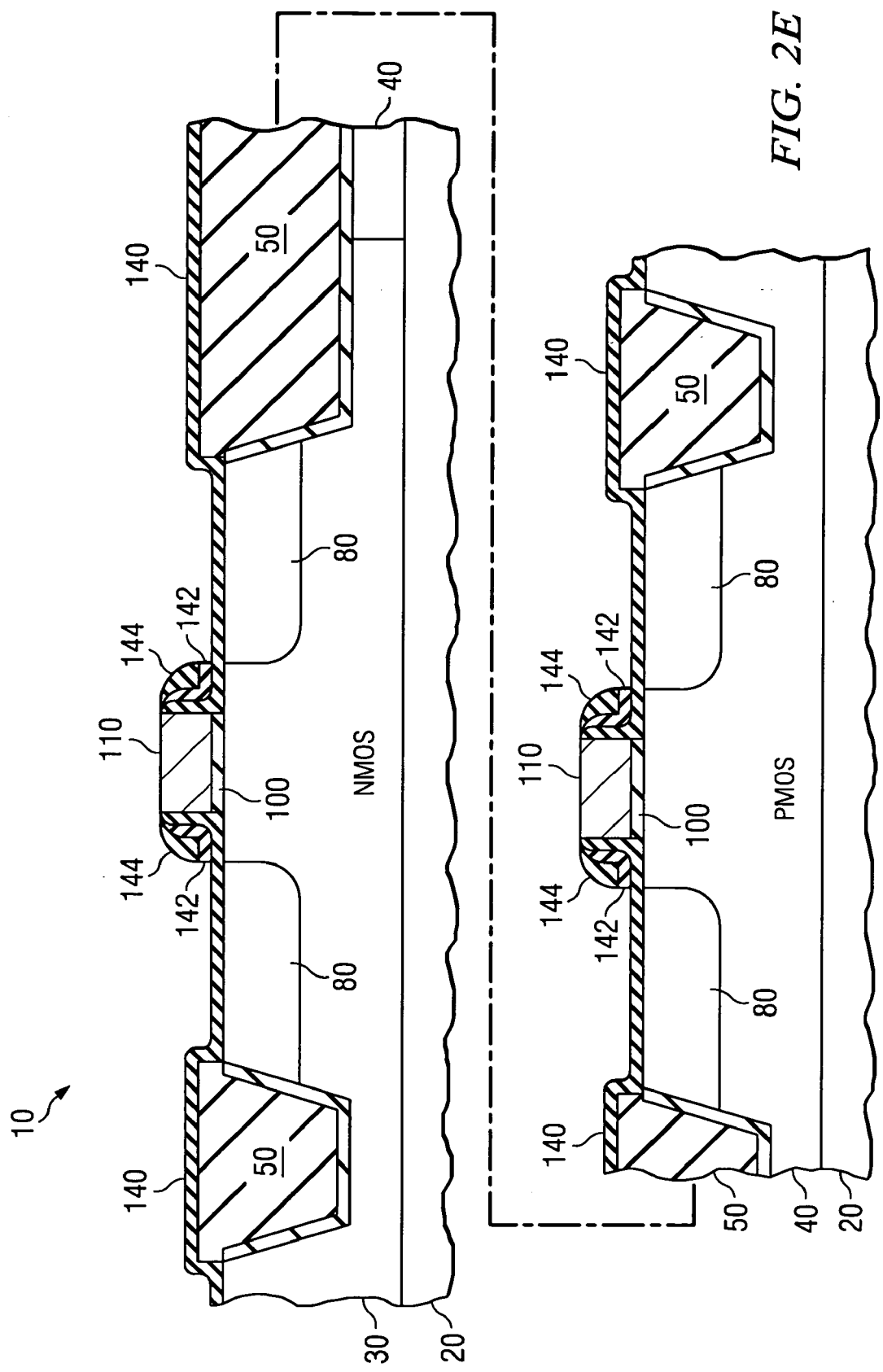
Figure 2F:
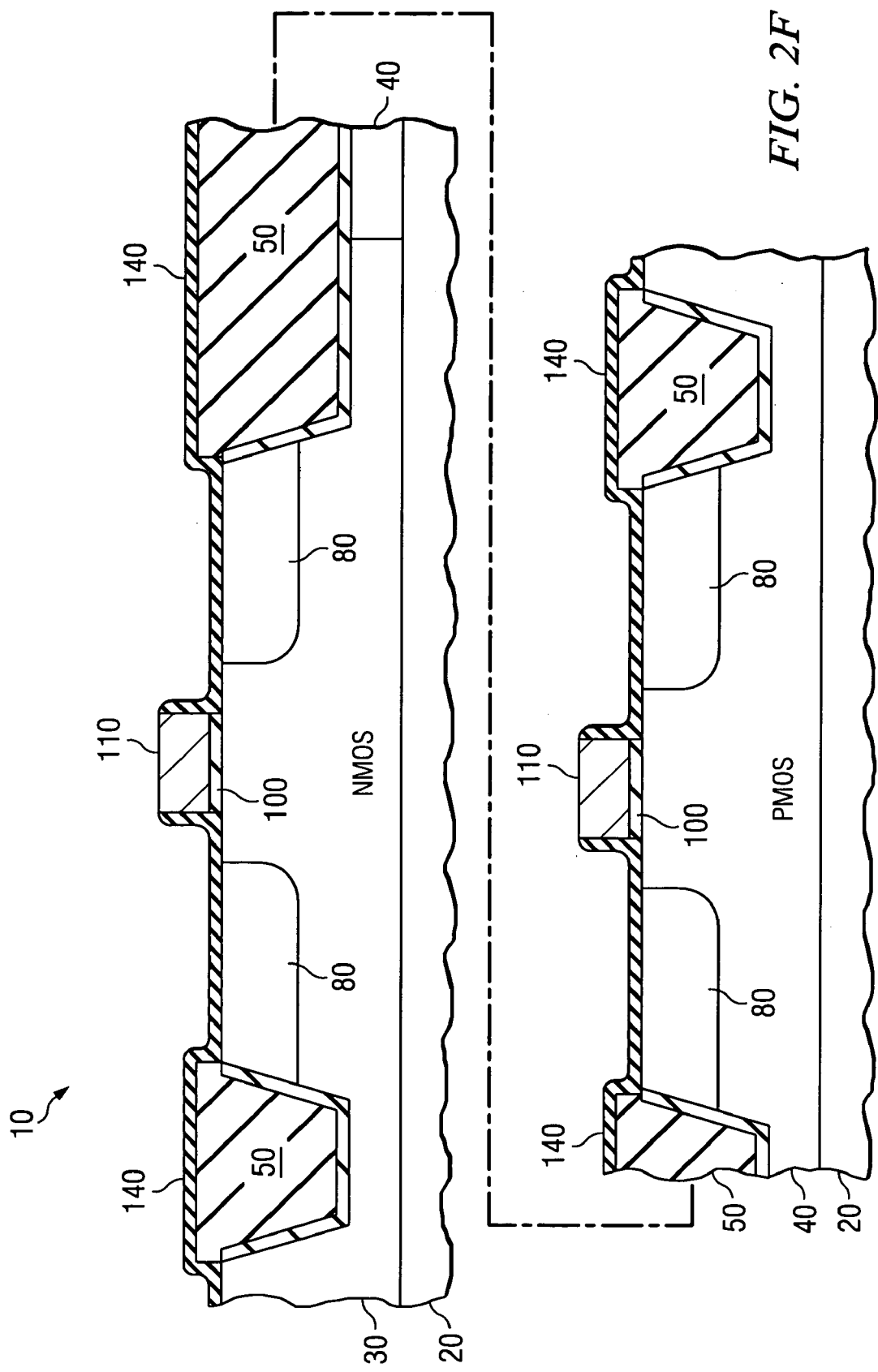
Figure 2G:
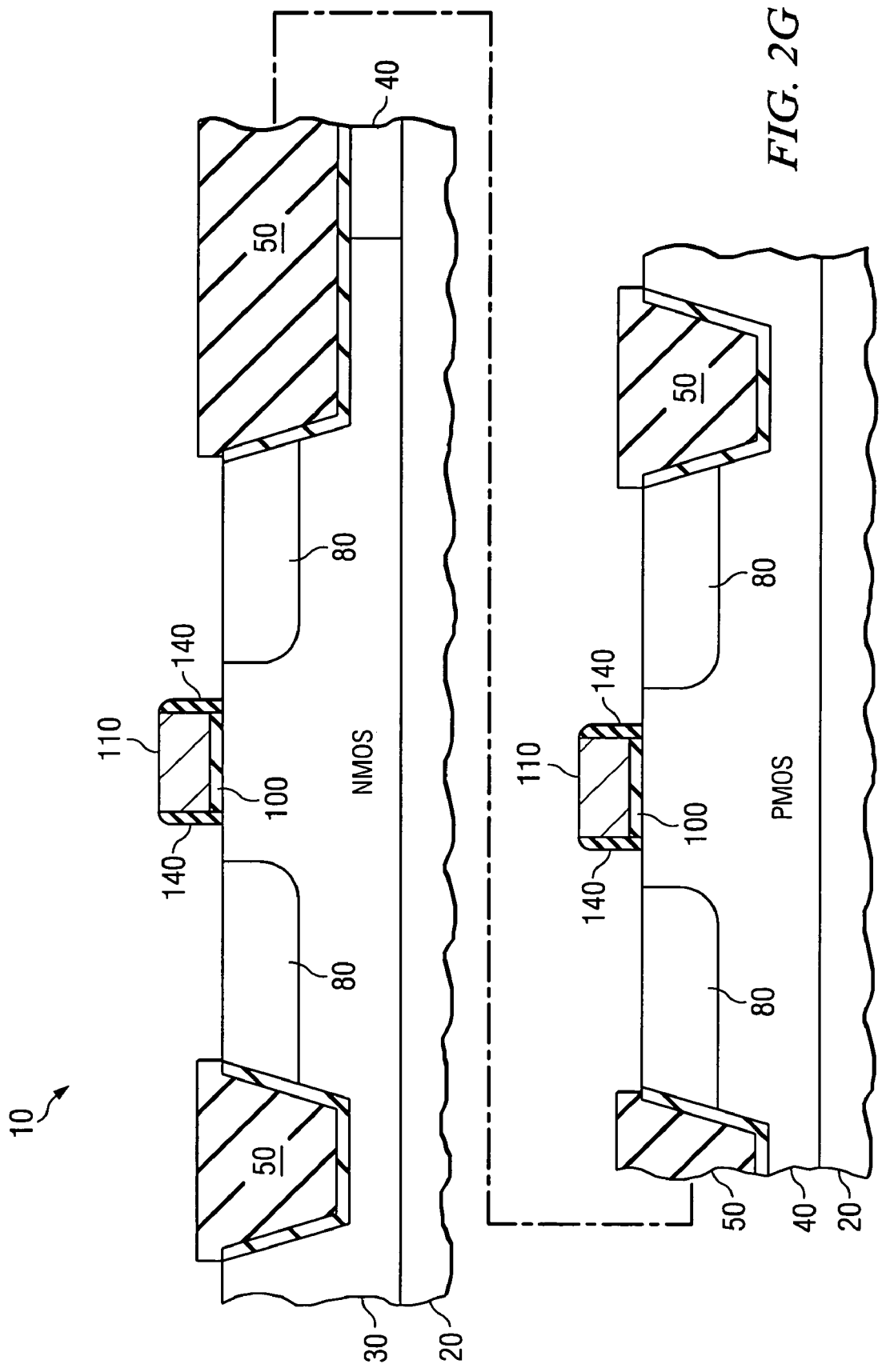
Figure 2H:
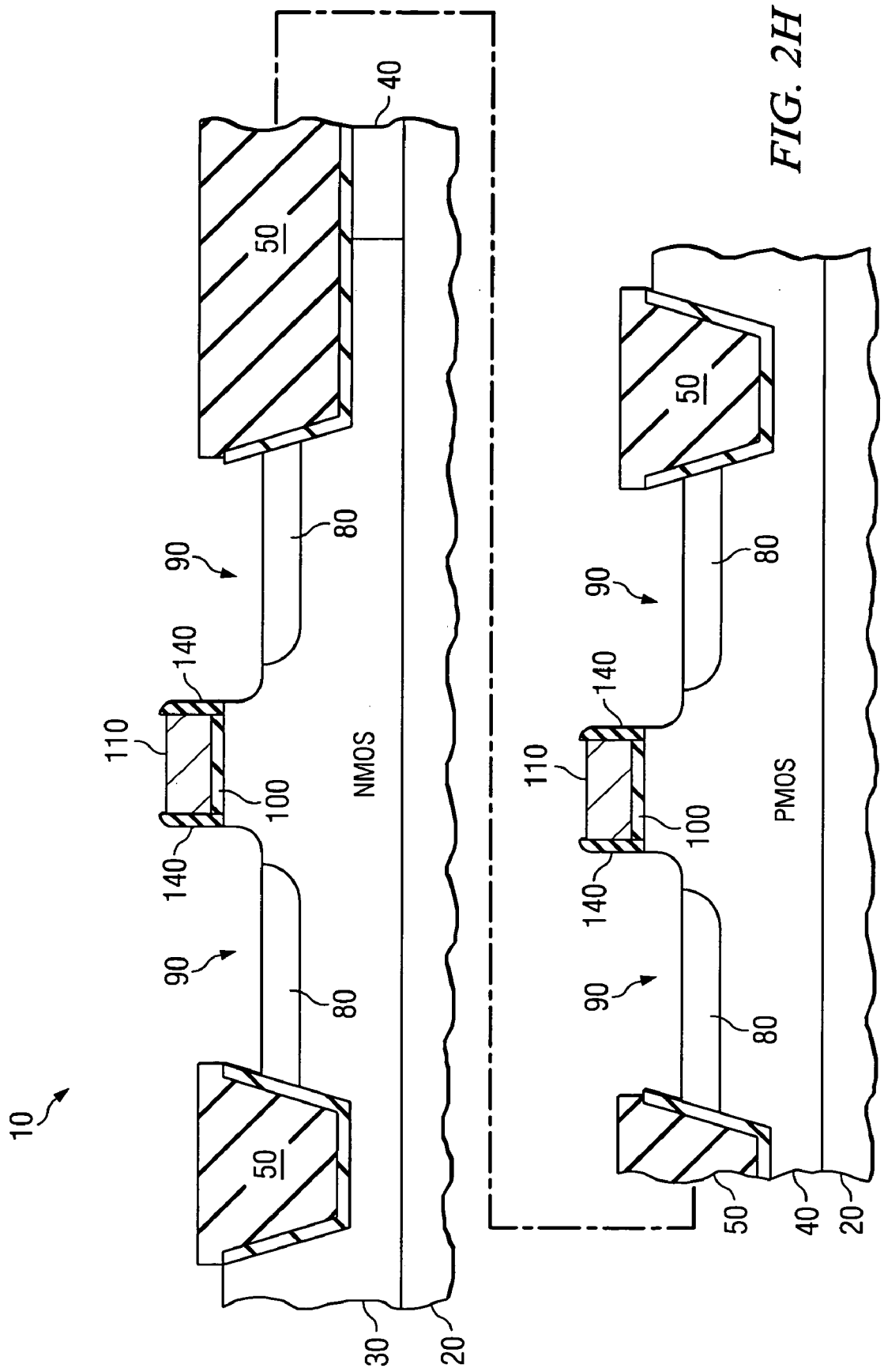
Figure 2I:
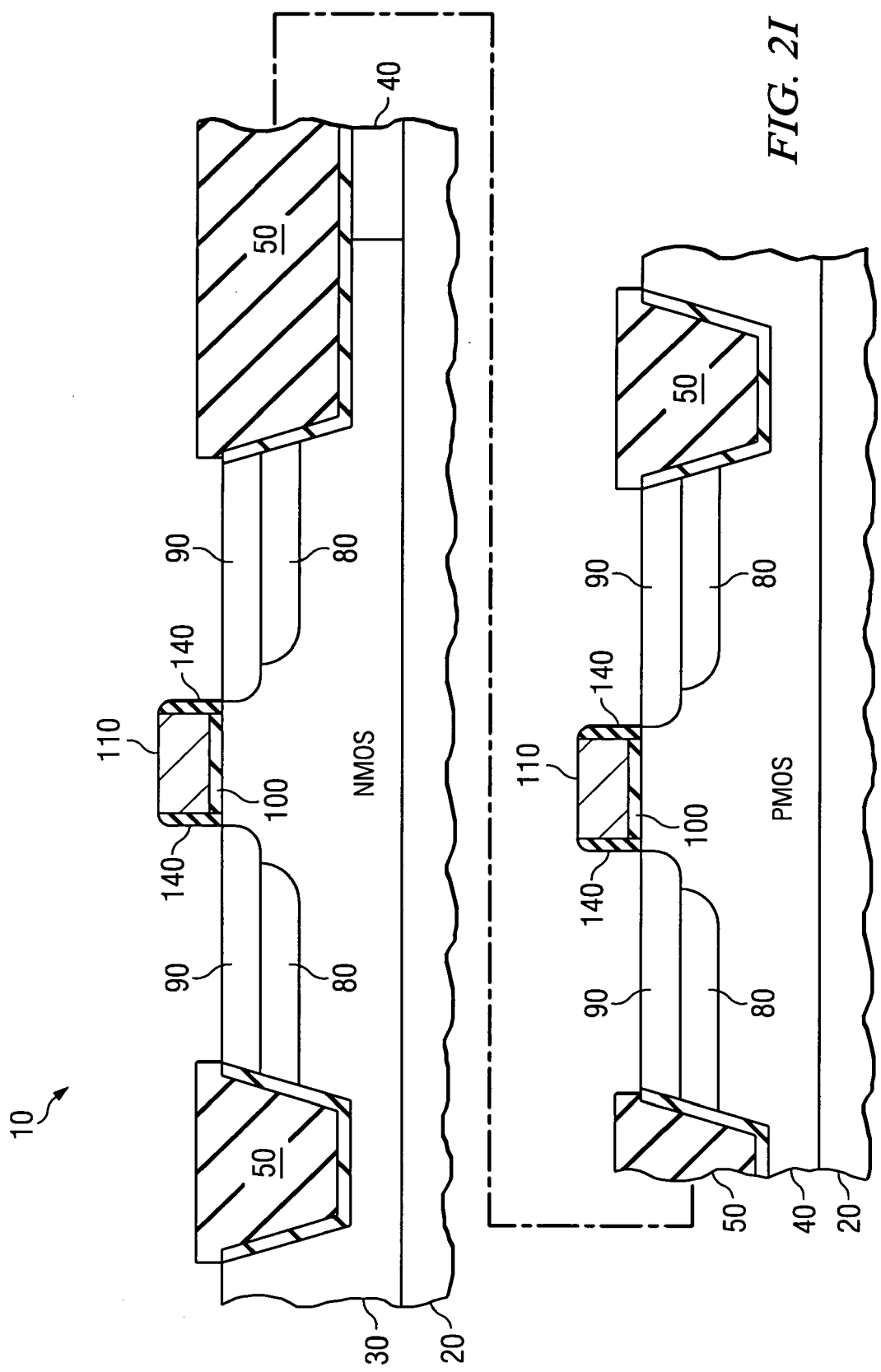
Figure 2J:
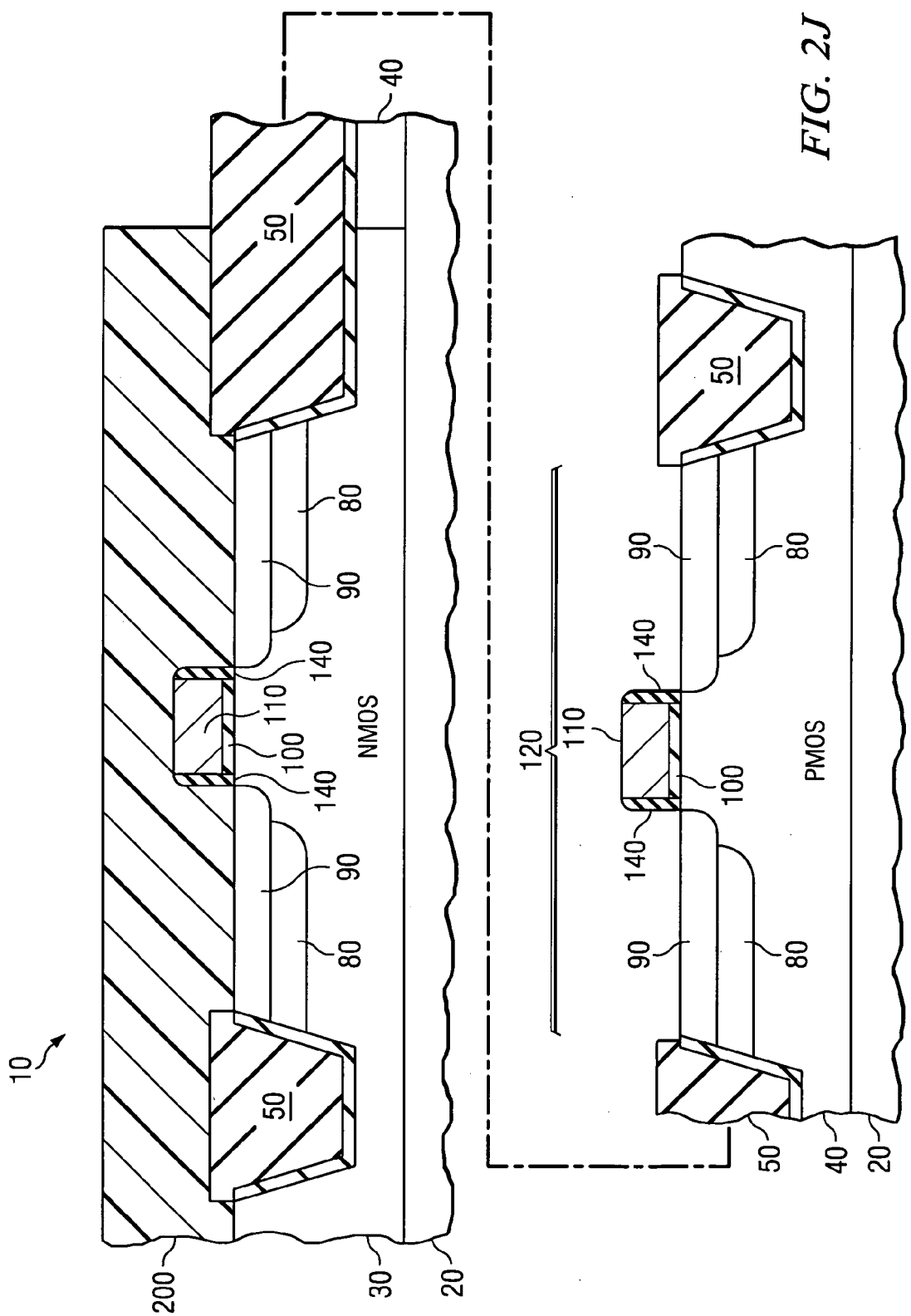
Figure 2K:
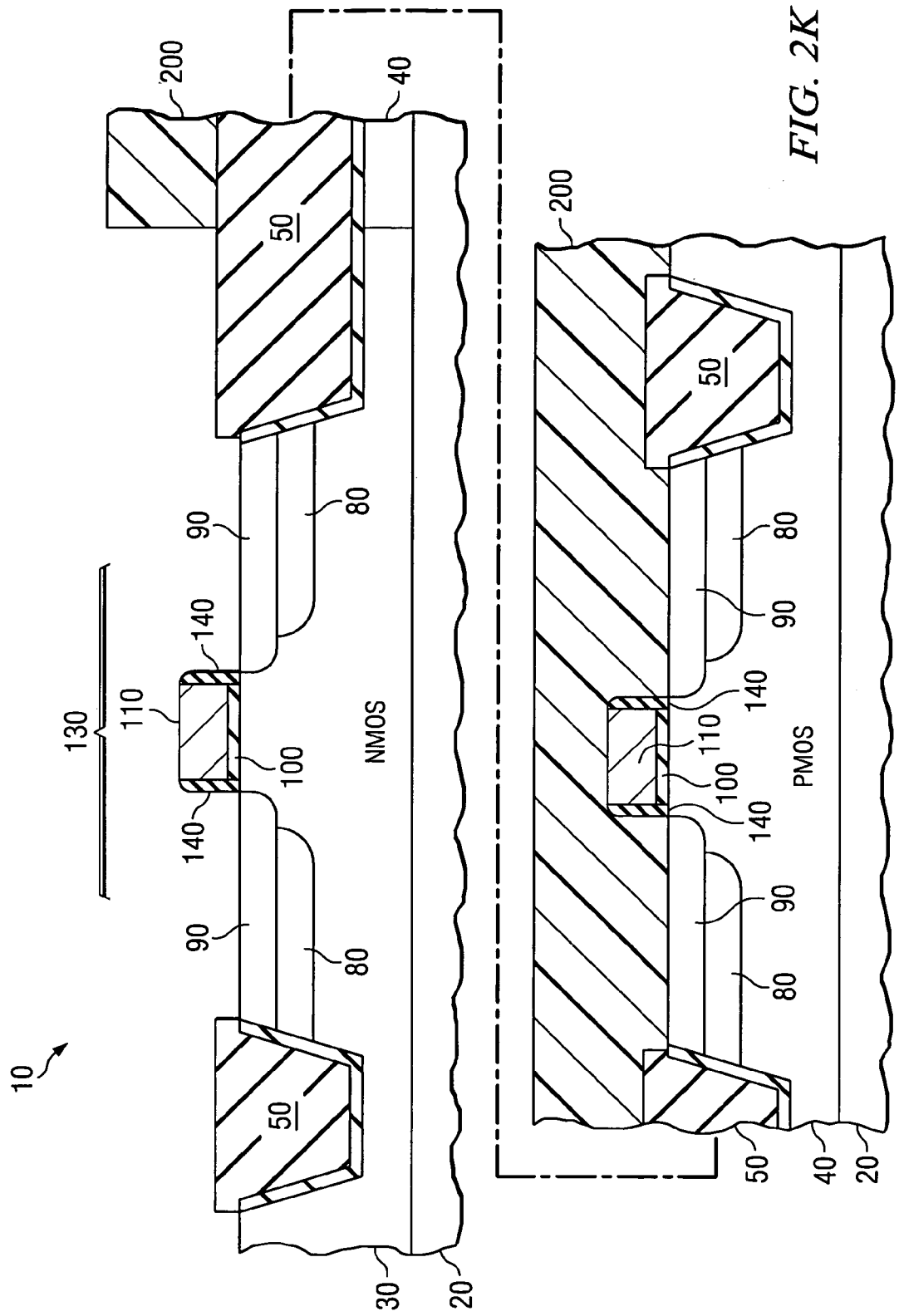
Figure 2L:
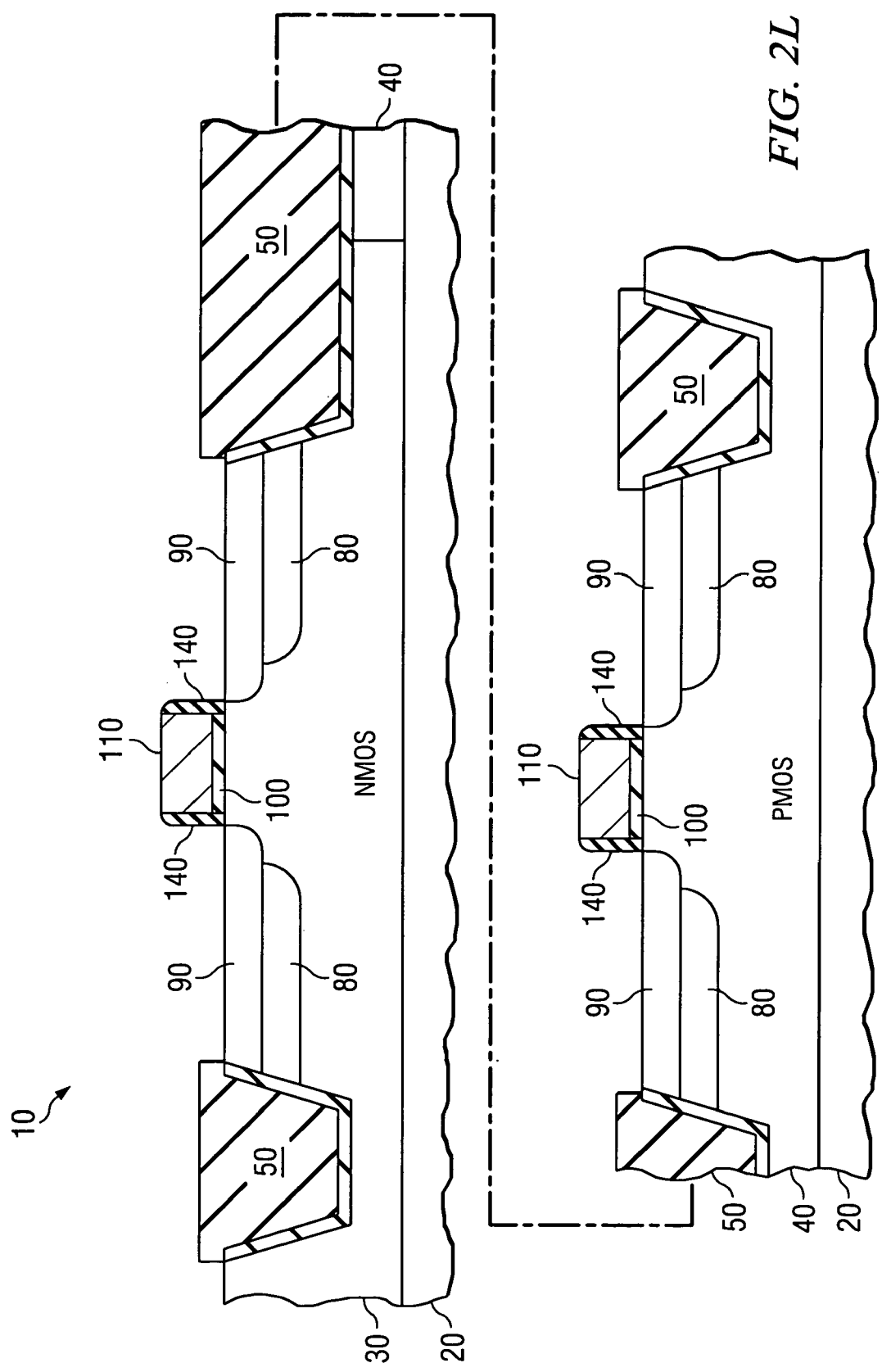
Figure 2M:
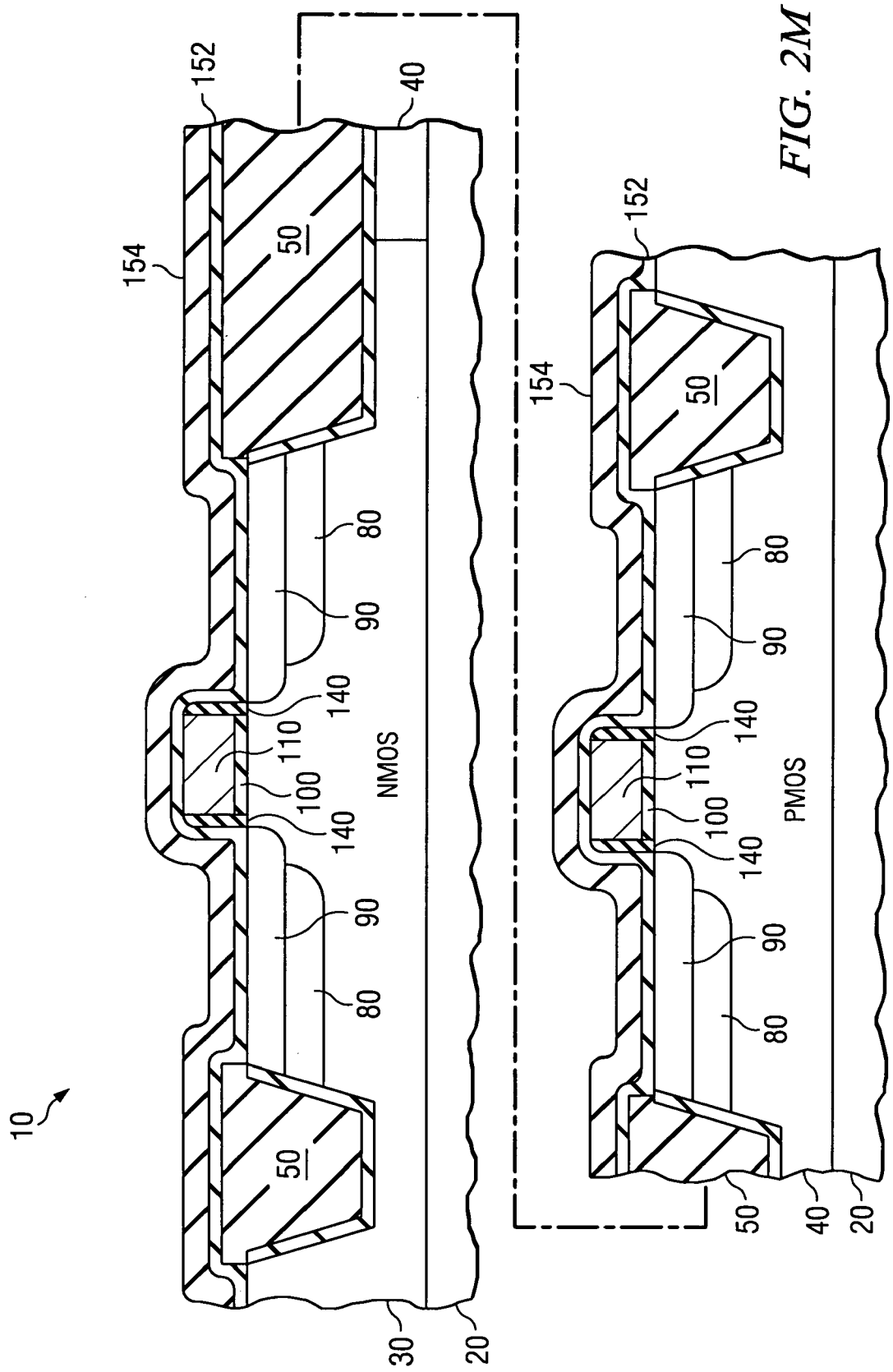
Figure 2N:
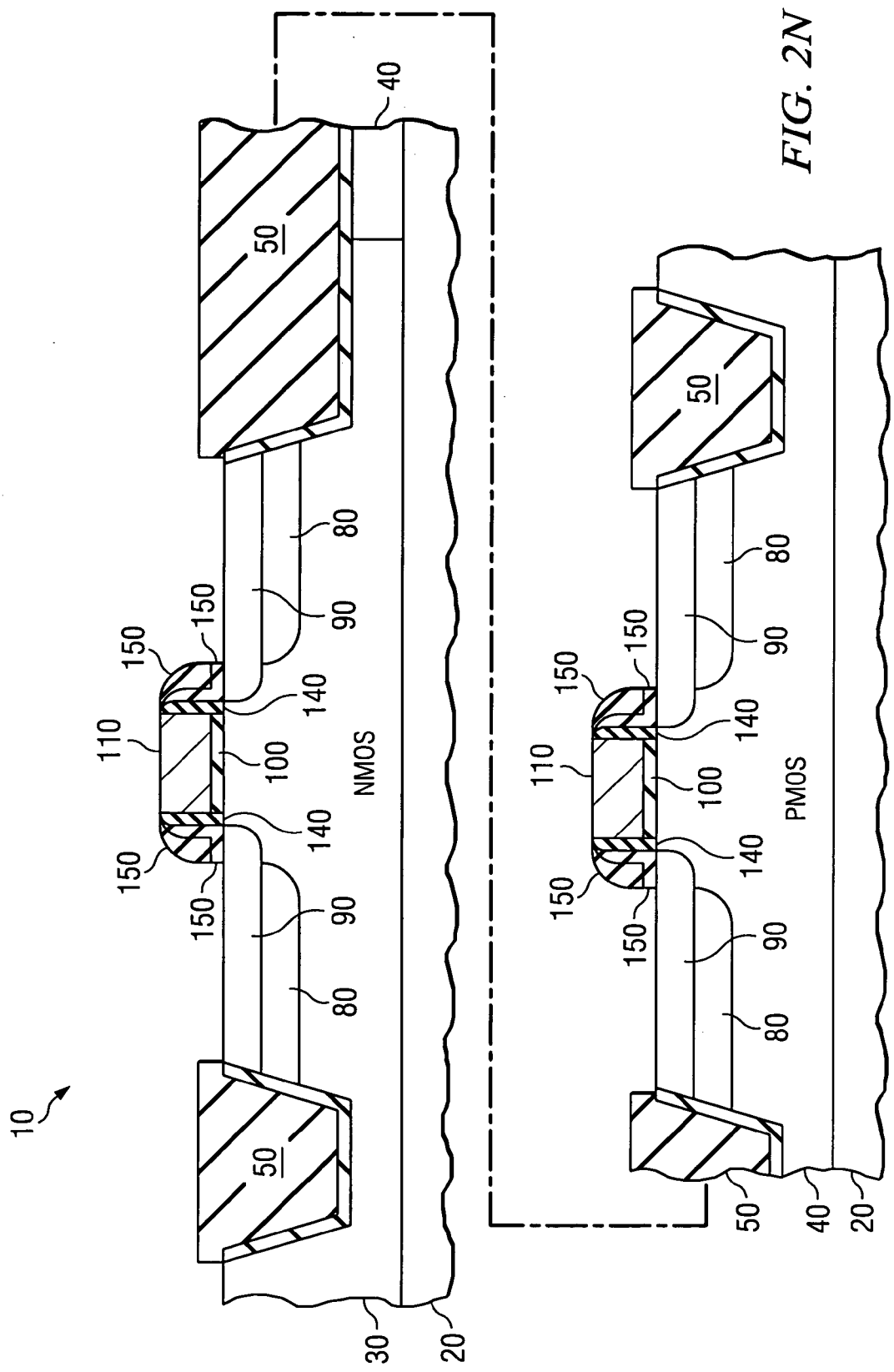
Figure 2O:
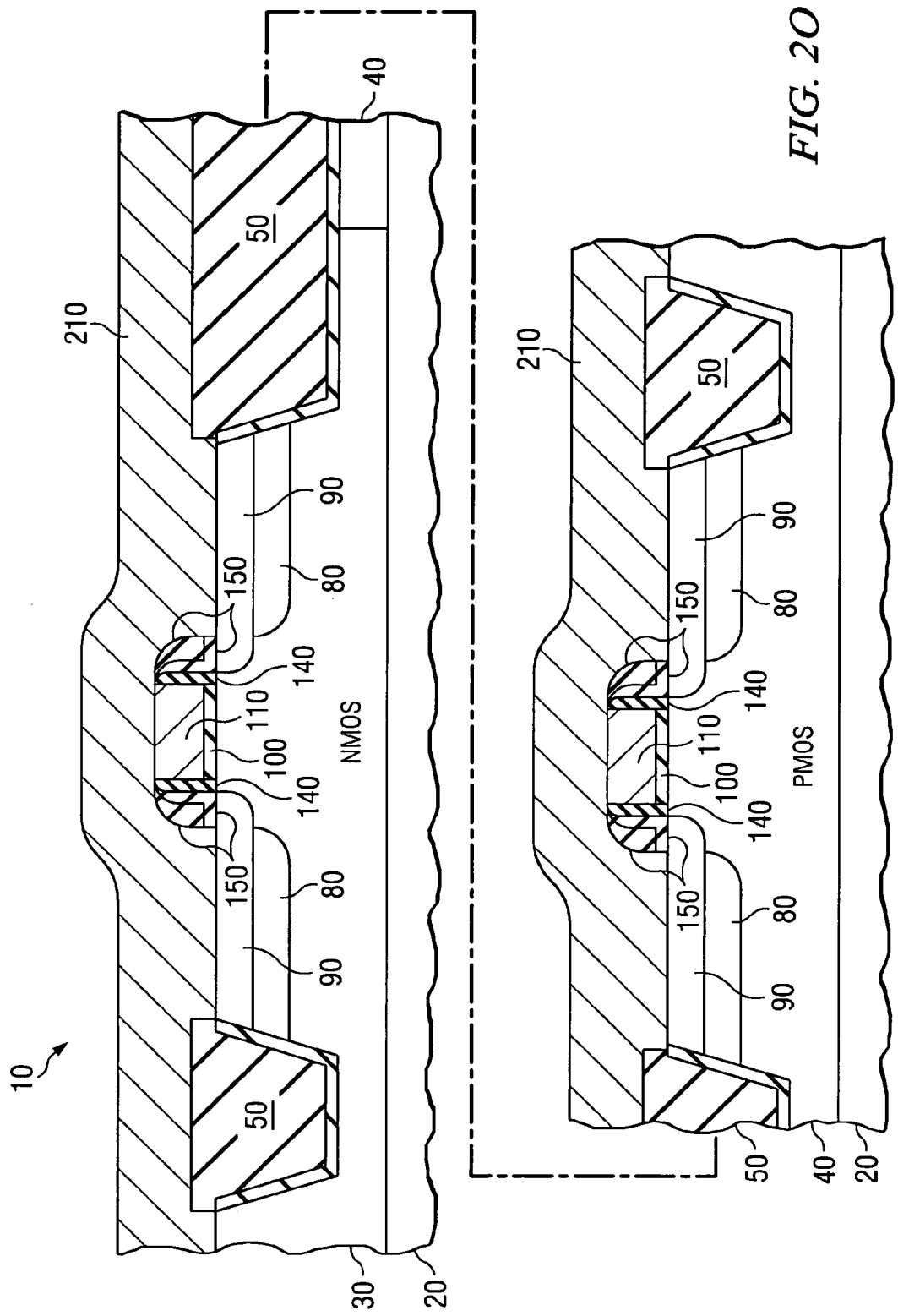
Figure 2P:
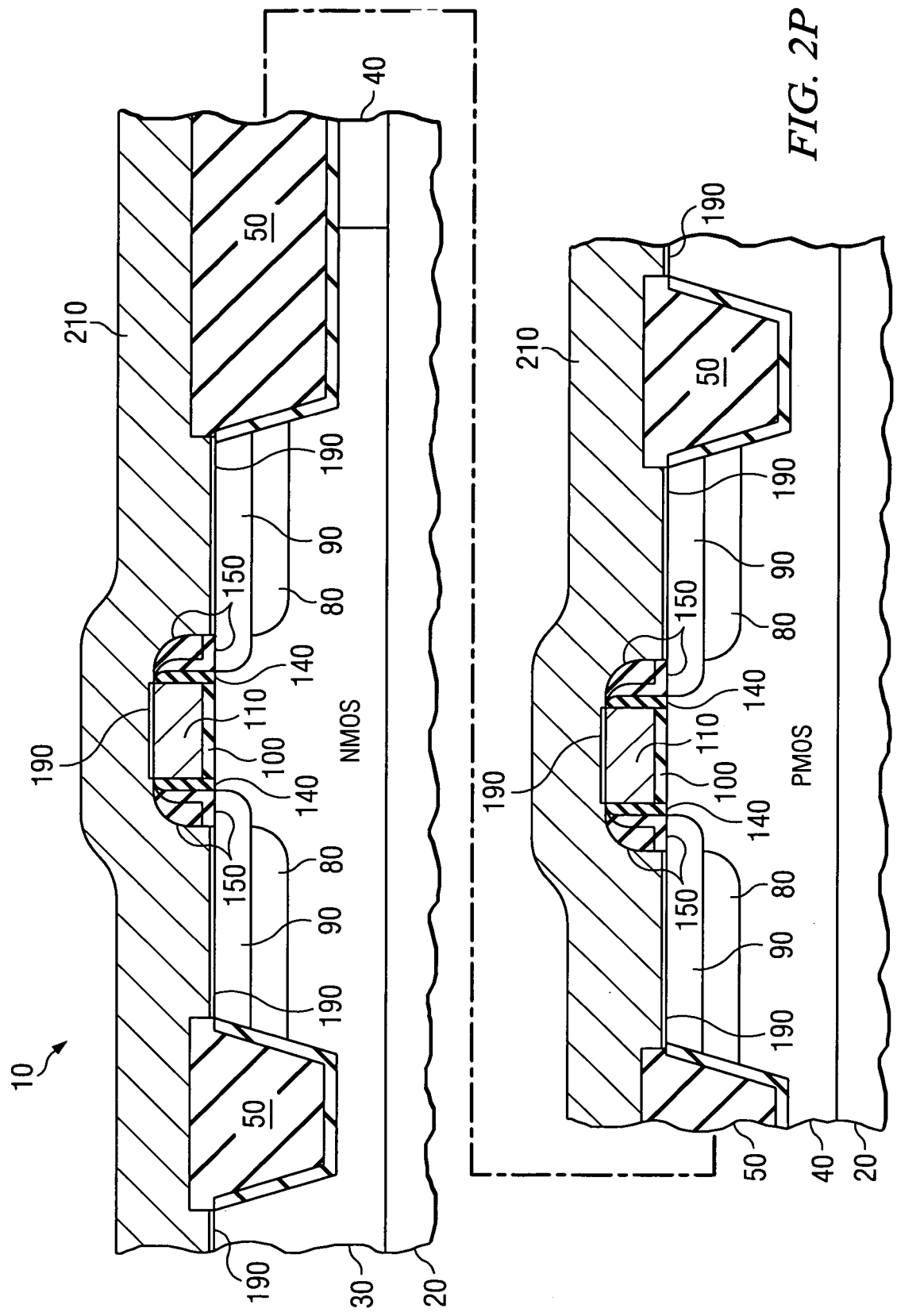
Figure 2Q:
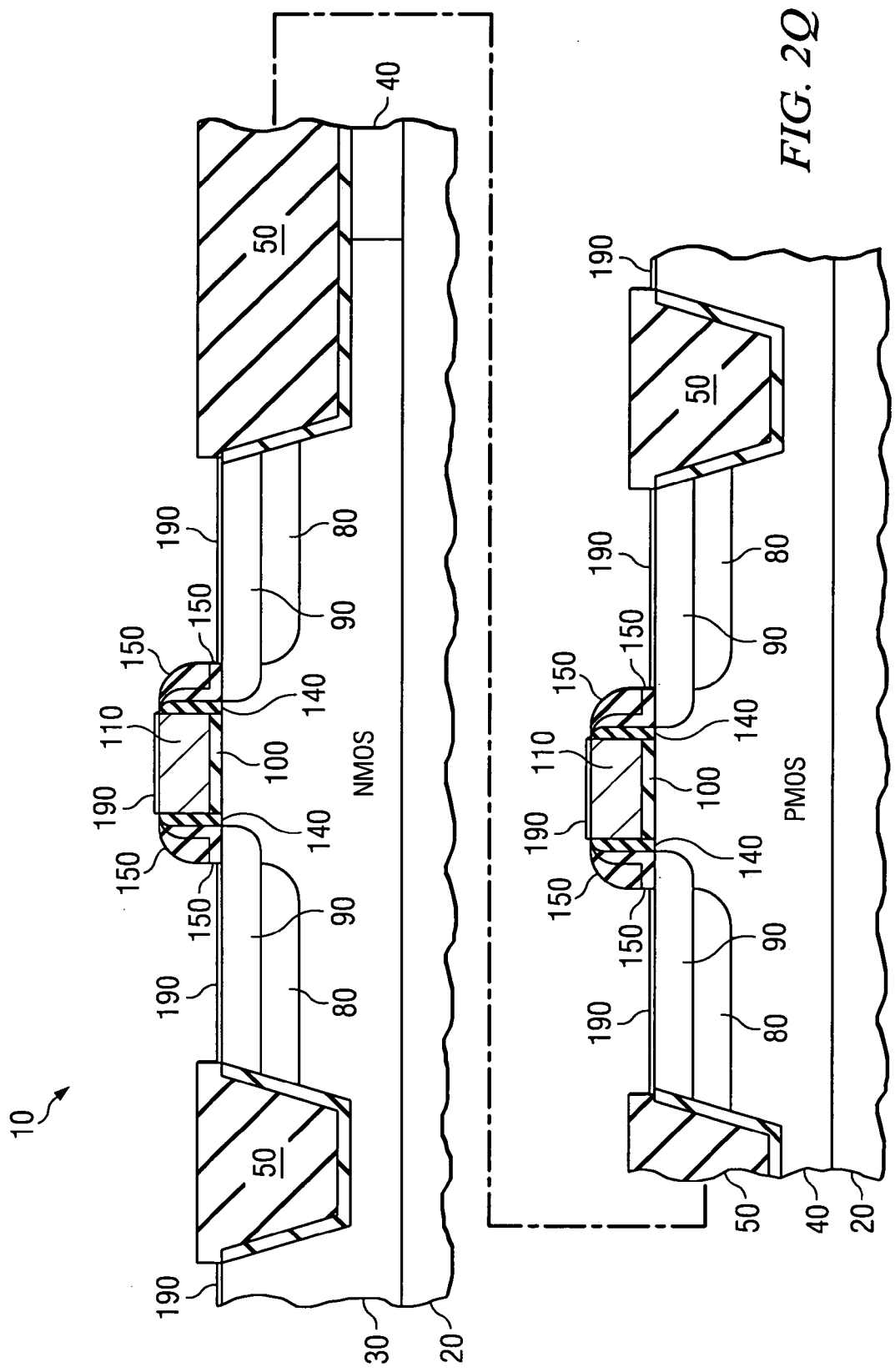

Referring again to the drawings, FIGS. 2A-2Q are cross-sectional views of a partially fabricated semiconductor wafer illustrating a process for forming transistors 120, 130 in accordance with one embodiment of the present invention.

FIG. 2A is a cross-sectional view of the semiconductor wafer 10 after the formation of the p-wells 30, n-wells 40, shallow trench isolation structures 50, and the gate stack 100, 110 on the top surface of a semiconductor substrate 20. The fabrication processes used to form the semiconductor wafer 10 shown in FIG. 2A are those that are standard in the industry.

In the example application, the semiconductor substrate 20 is silicon; however any suitable material such as germanium or gallium arsenide may be used. The example gate silicon oxide layer 100 is silicon dioxide formed with a thermal oxidation process. However, the gate dielectric layer 100 may be any suitable material, such as nitrided silicon oxide, silicon nitride, or a high-k gate dielectric material, and may be formed using any one of a variety of processes such as an oxidation process or thermal nitridation.

The gate polysilicon electrode 110 is comprised of polycrystalline silicon in the example application. However, it is within the scope of the invention to use other materials such as an amorphous silicon, a silicon alloy, or other suitable materials. The gate polysilicon layer 110 may be formed using any process technique such as chemical vapor deposition ("CVD") or physical vapor deposition ("PVD").

The gate stack may be created through a variety of processes. For example, the gate stack may be created by forming a layer of photoresist over the semiconductor wafer, patterning the photoresist, and then using the patterned photoresist to etch the layer of silicon oxide 100 and the layer of polysilicon 110. The gate stack may be etched using an suitable etch process, such as an anisotropic etch.

Generally, the next step in the fabrication of the transistors 120, 130 is the formation of the source/drain extension regions. However, the deep sources/drains are formed next in the present invention. Referring to FIG. 2B, the source/drain extension sidewall spacer layer 140 is now formed on the outer surface of the gate stack 100, 110. The source/drain extension sidewall spacer layer 140 is comprised of oxide. However, the source/drain extension sidewall spacer layer 140 may be comprised of any suitable material, such as an oxynitride, silicon dioxide, nitride, or any other dielectric material or layers of dielectric materials. In addition, the extension sidewall spacer layer 140 may be formed with any suitable process, such as thermal oxidation, deposited oxide, CVD, or PVD.

Next, disposable deep source/drain sidewall spacers 142, 144 are formed proximate to the extension sidewall spacer layer 140, as shown in FIG. 2C. These sidewall spacers are considered disposable because they will not be left on the final semiconductor wafer 10. The deep source/drain sidewall spacers 142, 144 may be formed using any standard process. In the example application shown in FIG. 2C, the preferred deep source/drain sidewall spacers are comprised of an oxide layer 142 and a silicon nitride layer 144 that are formed with a CVD process and subsequently anisotropically etched. However, it is within the scope of the invention to use more layers (i.e. a spacer oxide layer, a silicon nitride layer, and a final oxide layer) or less layers (i.e. just an oxide layer or a nitride layer) to create the deep source/drain sidewall spacers 142, 144.

The deep source/drain sidewall spacer layers are now etched to create the deep source/drain sidewall spacers 142, 144 shown in FIG. 2D. In the example application, the deep source/drain sidewall layers 142 and 144 are etched with a standard anisotropic plasma etch. This etch may be performed using any suitable machine such as an etching machine made by Applied Materials. The nitride layer 144 is etched first, using suitable anisotropic etch chemistry such as $CF_4$. Then, the oxide layer 142 is etched (generally in the same etch machine) using any suitable anisotropic etch chemistry such as $CF_4+Ar$. The formation of the deep source/drain sidewall spacers 142, 144 is now complete and the semiconductor wafer 10 is subjected to a standard post-etch cleaning process (i.e. using a FSI Mercury machine with a wet chemistry of Piranha+SC1).

The next step is to use the disposable deep source/drain sidewall spacers 142, 144 (as well as the gate silicon layer 110) as a template for the implantation of dopants into the locations for the deep sources and drains. The implantation of dopants into the locations for the deep sources and drains 80, shown in FIG. 2E, may be accomplished through any one of a variety of processes, such as deep ion implantation or deep diffusion. The dopants used to create the deep sources and drains 80 for PMOS transistors are typically boron and for NMOS transistors are typically arsenic; however, other dopants or combinations for dopants may be used.

The implantation of the dopants is self-aligned with respect to the outer edges of the deep source/drain sidewall spacers 142, 144. However, it is to be noted that due to lateral straggling of the implanted species, the deep sources/drains 80 initiate slightly inside the outer corner of the deep source/drain sidewall spacers 144.

Now the disposable deep source/drain sidewall spacers 142, 144 are removed. Any suitable process may be used to remove the sidewall spacers 142, 144, such as a wet etch process. The semiconductor wafer 10 at this stage in the manufacturing process is shown in FIG. 2F.

In the example application, the source/drain regions 80 are activated by a source/drain anneal step. However, this anneal step may be performed at any stage in the manufacturing process, such as before the removal of the deep source/drain sidewall spacers 142, 144. This anneal step acts to repair the damage to the semiconductor wafer and to activate the dopants in the deep sources/drains 80. The activation anneal may be performed by any technique such as Rapid Thermal Anneal ("RTA"), flash lamp annealing ("FLA"), or laser annealing. In the example application, the RTA is performed at a temperature of approximately 1050° C. This anneal step often causes lateral and vertical migration of dopants in the deep sources and drains 80.

Now, as shown in FIG. 2G, the source/drain extension sidewall spacer 140 is reshaped to create the final source/drain extension sidewall spacer structures 140. In the example application the source/drain extension sidewall spacer layer 140 is reshaped using an anisotropic etch process; however, any suitable process may be used.

These source/drain extension sidewall spacers 140 are now used as a template to facilitate the proper placement of the source/drain extensions 90, as shown in FIG. 2H. The first step in the formation of the source/drain extensions 90 is etching the semiconductor wafer 30, 40 to create recesses at the locations of the source/drain extensions 90. Any suitable manufacturing process may be used to etch the wafer surface, such as an anisotropic silicon etch using an AMAT plasma etcher. It is to be noted that this plasma etch may also slightly reduce the height of the gate polysilicon layer 110.

The next step in the formation of the source/drain extensions 90 in the example application is the deposition of SiGe on the exposed silicon surfaces. More specifically, any suitable process such as selective epitaxial deposition is used to deposit SiGe into the recesses for the source/drain extensions 90 and the gate polysilicon 110. Preferably, SiGe is deposited so that the original thickness of the source/drain extension 90 is restored, as shown in FIG. 2I. However, it is within the scope of the invention to create source/drain extensions 90 having a higher or lower surface than the original surface of the semiconductor wafer 30, 40.

The composition of the SiGe deposited in the recesses of the source/drain extensions 90 can be adjusted to accommodate a targeted melting point. In general, a higher Ge content results in a lower melting point for the deposited SiGe material. Preferably, the SiGe that is deposited contains 20% Ge by volume and a melting point of approximately 1300° C. Therefore, the melting point of the SiGe source/drain extensions 90 is lower than the melting point of the silicon (20, 30, 40, 80, and 110) and the other materials (50, 140) of the semiconductor wafer 10 at this stage of the manufacturing process.

The next step in the formation of the source/drain extensions 90 is ion implantation of dopant species into the source/drain extensions 90. A standard mask process is used to facilitate the implantation of dopants into the SiGe source/drain extensions 90 of the NMOS transistors that are different than the dopants implanted into the SiGe source/drain extensions 90 of the PMOS transistors. As shown in FIG. 2J, photoresist material 200 is deposited over the semiconductor wafer 10 and then patterned to expose the PMOS transistor 120 (and simultaneously protect the NMOS transistor). Now, any suitable process such as such as ion implantation or plasma doping may be used to implant dopants into the SiGe source/drain extensions 90 of the PMOS transistor 120. Preferably, B is implanted into the SiGe source/drain extensions 90 of the PMOS transistor 120; however, any other dopant such as $BF_2$ may be deposited. In addition, B is preferably deposited at a concentration above $2 \times 10^{20}$ atoms/cc. It is to be noted that the energy setting of the ion implanter will determine the depth at which the majority of dopants will reside at this stage in the manufacturing process.

Now the patterned photoresist 200 is removed from the semiconductor wafer 10 with a standard ashing process. Next, a layer of photoresist 200 is reapplied to the semiconductor wafer 10 and patterned to expose the NMOS transistors 130 (and simultaneously protect the PMOS transistor 120), as shown in FIG. 2K. The ion implantation process is repeated and dopant is now deposited in the SiGe source/drain extensions 90 of the NMOS transistor 130. Preferably, the dopant is As that is deposited at a concentration above $4 \times 10^{20}$ atoms/cc. However, other suitable dopants may be deposited, such as P at a concentration above $4 \times 10^{20}$ atoms/cc or As plus P at a concentration above $8 \times 10^{20}$ atoms/cc. Once the SiGe source/drain extensions 90 of the NMOS transistor 130 are implanted with dopants, a standard ashing process is used to remove the photoresist 200, as shown in FIG. 2L.

The dopants within the SiGe source/drain extensions 90 are now activated by an annealing process. This post extension implant anneal step is preferably performed with a continuous wave ("CW") laser annealing process. For example, a $CO_2$ laser annealer may be used for a duration between 200 µs and 5 ms at a power density between 0.2 kW/mm$^2$ and 1 kW/mm$^2$ (but preferably at 0.5 kW/mm$^2$). The laser radiation will cause the dopants to rapidly diffuse. The resultant SiGe source/drain extensions 90 will have evenly distributed and highly activated dopants.

In addition, the SiGe source/drain extensions 90 will have extremely abrupt junctions. The extremely abrupt junctions are formed by the present invention because the melting point of the SiGe source/drain extensions 90 is lower than the other components of the semiconductor wafer 10 (preventing almost all of the dopants from crossing into the silicon wafer 30, 40). Therefore, only the SiGe source/drain extensions 90 will melt during the laser annealing process.

It is within the scope of the invention to use other suitable processes for this annealing step. For example, a pulsed laser anneal, a flash anneal, or an arc lamp anneal may be used.

An optional additional anneal is now performed to reduce the crystal damage within the semiconductor wafer 10. This additional anneal may be performed using any suitable process such as a flash RTA.

The next step in the example manufacturing process is the silicide loop. The purpose of the silicide loop is the creation of silicide 190 (see FIG. 1). However, the semiconductor wafer 10 is prepared for the silicide loop by forming contact sidewall spacers 150, which will be used to facilitate the proper placement of the silicide 190. As shown in FIG. 2M, the first step in the formation of the preferred contact sidewall spacers 150 is the deposition of the oxide layer 152. The oxide layer 152 may be deposited by any suitable process such as CVD. Next, the nitride layer 154 is deposited over the oxide layer 152. The nitride layer 154 may also be deposited by any suitable process such as CVD. It is within the scope of the invention to use more layers (i.e. a spacer oxide layer, a silicon nitride layer, and a final oxide layer) or less layers (i.e. just an oxide layer or a nitride layer) to create the contact sidewall spacers.

The contact sidewall spacer layers 152, 154 are now etched to create the contact sidewall spacers 150, as shown in FIG. 2N. In the example application, the contact sidewall nitride layer 154 is etched with a standard anisotropic dry etch. Then the contact sidewall oxide layer 152 is etched with a standard wet or dry etch. The formation of the contact sidewall spacers 150 is now complete and the semiconductor wafer 10 is subjected to a standard post-etch cleaning process. The active silicon surfaces of the semiconductor wafer 10 are now exposed and ready for further processing.

The first step of the silicide loop is the deposition of an interface layer 210 over the top surface of the semiconductor wafer 10, as shown in FIG. 2O. The interface layer 210 is preferably comprised of Ni; however, other suitable materials such as Co may be used.

An optional capping layer (not shown) may also be formed over the interface layer 210. If used, the capping layer acts as a passivation layer that prevents the diffusion of oxygen from ambient into the interface layer 210. The capping layer may be any suitable material, such as TiN.

The second step of the silicide loop is an anneal. The semiconductor wafer 10 may be annealed with any suitable process, such as RTA. This anneal process will cause a silicide 190 (i.e. a Ni-rich silicide or Ni mono-silicide) to form over all active surfaces that are in contact with the interface layer 210; namely, at the surface of the source/drain extensions 90, the surface of the well regions 30, 40, and the surface of the gate electrodes 110. These silicide regions 190 are shown in FIG. 2P.

It is to be noted that the interface layer 210 will only react with the active substrate (i.e. exposed Si); namely, the source/drain extensions 90, the gate electrode 110, and the unmodified surfaces of well regions 30, 40. Therefore, the silicide 190 formed by this annealing process is considered a self-aligned silicide ("salicide").

The third step in the silicide loop is the removal of the interface layer 210, as shown in FIG. 2Q. The interface layer 210 (and the capping layer, if used) are removed using any suitable process such as a wet etch process (i.e. using a fluid mixture of sulfuric acid, hydrogen peroxide, and water).

The fourth step of the silicide loop is to perform a second anneal (such as a RTA) to further react the silicide 190 with the exposed surfaces of well regions 30, 40, the gate electrode 110, and the extension sources and drains 90. If the initial anneal process of the silicide loop did not complete the silicidation process, this second anneal will ensure the formation of a mono-silicide NiSi—which lowers the sheet resistance of the silicide 190.

The fabrication of the semiconductor wafer 10 now continues using standard manufacturing processes. Generally, the next step is the formation of the dielectric layer. Referring to FIG. 1, the dielectric insulator layer 160 may be formed using plasma-enhanced chemical vapor deposition ("PECVD") or another suitable process. The dielectric insulator 160 may be comprised of any suitable material such as $SiO_2$ or OSG.

The contacts 170 are formed by etching the dielectric insulator layer 160 to expose the desired gate, source and/or drain location. An example etch process for creating the contact holes is an anisotropic etch. The etched holes are usually filled with a liner 180 before forming the contacts 170 in order to improve the electrical interface between the silicide 190 and the contact 170. Then the contacts 170 are formed within the liner 180; creating the initial portion of the electrical interconnections from the transistors 120, 130 to various semiconductor components (not shown) located within the semiconductor substrate 10.

The fabrication of the final integrated circuit now continues with the fabrication of the back-end structure (not shown). As discussed above, the back-end structure contains the metal interconnect layers of the integrated circuit. Once the fabrication process is complete, the integrated circuit will be tested and packaged.

Various additional modifications to the invention as described above are within the scope of the claimed invention. As an example, the semiconductor wafer 10 may be subjected to a wafer cleaning process after any step in the manufacturing process to remove contamination from the wafer. In addition, an anneal process may be performed after any step in the above-described fabrication process. When used, the anneal process can improve the microstructure of materials and thereby improve the quality of the semiconductor structure.

Furthermore, the silicides 190 may be comprised of other materials such as titanium, tungsten, tantalum, or other conventional silicide materials or combinations of silicide materials. Similarly, instead of depositing SiGe, other suitable materials such as amorphous silicon ("αSi") may be deposited in the recesses of the source/drain extensions 90 to form αSi source/drain extensions 90. Moreover, this invention may be implemented in other semiconductor structures such as capacitors or diodes, and also in different transistor structures such as biCMOS and bipolar transistors.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for making a transistor within a semiconductor wafer, comprising:
   forming a gate stack, said gate stack having a gate silicon oxide layer coupled to said semiconductor wafer and a gate polysilicon layer coupled to said gate silicon oxide layer;
   forming source/drain extension sidewall spacers coupled to said gate stack;
   forming deep source/drain sidewall spacers coupled to said source/drain extension sidewall spacers;
   implanting dopants into said semiconductor wafer at deep source/drain locations;
   removing said deep source/drain sidewall spacers;
   reshaping said source/drain extension sidewall spacers;
   etching a recess in a surface of said semiconductor wafer at source/drain extension locations;
   depositing SiGe within each said recess to form SiGe source/drain extensions;
   implanting dopants into said SiGe source/drain extensions; and
   performing a first post extension implant anneal of said semiconductor wafer.

2. The method of claim 1 further comprising:
   performing a second post extension implant anneal of said semiconductor wafer;
   forming contact sidewall spacers coupled to said etched source/drain extension sidewall spacers; and
   performing a silicide loop to form a silicide within exposed top surfaces of said SiGe source/drain extensions and said gate polysilicon layer.

3. The method of claim 2 wherein said step of performing a second post extension implant anneal of said semiconductor wafer comprises a flash RTA.

4. The method of claim 2 wherein said step of forming contact sidewall spacers comprises:
   forming a layer of oxide over said semiconductor wafer;
   forming a layer of silicon nitride over said layer of oxide; and
   etching said layers of oxide and nitride to form said contact sidewall spacers.

5. The method of claim 2 wherein said step of performing a silicide loop comprises:
   forming an interface layer over said semiconductor wafer;
   performing a first silicide anneal to form said silicide on said exposed top surfaces of said SiGe source/drain extensions and said gate polysilicon layer;
   removing said interface layer; and
   performing a second silicide anneal to recrystalize said silicide.

6. The method of claim 5 wherein said interface layer comprises nickel.

7. The method of claim 1 further comprising:
annealing said semiconductor wafer to create deep source/drains before said step of removing said deep source/drain sidewall spacers.

8. The method of claim 1 further comprising:
annealing said semiconductor wafer to create deep source/drains after said step of removing said deep source/drain sidewall spacers.

9. The method of claim 1 wherein said step of forming source/drain extension sidewall spacers comprises forming a layer of oxide and then a layer of nitride over said semiconductor wafer.

10. The method of claim 1 wherein said step of forming deep source/drain sidewall spacers comprises:
forming a layer of oxide over said semiconductor wafer; and
forming a layer of nitride over said layer of oxide.

11. The method of claim 1 wherein said step of implanting dopants into said semiconductor wafer at deep source/drain locations comprises implanting B dopants at a concentration above $2 \times 10^{20}$ atoms/cc.

12. The method of claim 1 wherein said step of implanting dopants into said semiconductor wafer at deep source/drain locations comprises implanting P dopants at a concentration above $4 \times 10^{20}$ atoms/cc.

13. The method of claim 1 wherein said step of implanting dopants into said semiconductor wafer at deep source/drain locations comprises implanting As dopants at a concentration above $4 \times 10^{20}$ atoms/cc.

14. The method of claim 1 wherein said step of implanting dopants into said semiconductor wafer at deep source/drain locations comprises implanting a mixture of As and P dopants at a concentration above $8 \times 10^{20}$ atoms/cc.

15. The method of claim 1 wherein said deposited SiGe contains approximately 20% Ge.

16. The method of claim 1 wherein said deposited SiGe has a melting point of approximately 1300° C.

17. The method of claim 1 wherein said step of performing a first post extension implant anneal of said semiconductor wafer comprises a continuous wave laser anneal.

18. The method of claim 1 wherein said step of performing a first post extension implant anneal of said semiconductor wafer comprises a pulsed laser anneal.

19. The method of claim 1 wherein said step of performing a first post extension implant anneal of said semiconductor wafer comprises a flash anneal.

20. The method of claim 1 wherein said step of performing a first post extension implant anneal of said semiconductor wafer comprises a arc lamp anneal.

21. The method of claim 1 wherein said step of reshaping said source/drain extension sidewall spacers comprises anisotropically etching said source/drain extension sidewall spacers.

* * * * *